United States Patent
Chen et al.

(10) Patent No.: US 12,327,806 B2
(45) Date of Patent: Jun. 10, 2025

(54) SEMICONDUCTOR DIE WITH PECULIAR BOND PAD ARRANGEMENT FOR LEVERAGING MUTUAL INDUCTANCE BETWEEN BOND WIRES TO REALIZE BOND WIRE T-COIL CIRCUIT WITH EQUIVALENT NEGATIVE INDUCTANCE

(71) Applicant: Airoha Technology (HK) Limited, North Point (HK)

(72) Inventors: Huan-Sheng Chen, Hsinchu County (TW); Ming-Yin Ko, Hsinchu County (TW); Chun-Wei Chen, Hsinchu County (TW)

(73) Assignee: Airoha Technology (HK) Limited, North Point (HK)

( * ) Notice: Subject to any disclaimer, the term of this patent is extended or adjusted under 35 U.S.C. 154(b) by 430 days.

(21) Appl. No.: 17/839,469

(22) Filed: Jun. 13, 2022

(65) Prior Publication Data
US 2023/0402416 A1 Dec. 14, 2023

(51) Int. Cl.
*H01L 23/00* (2006.01)
*H01F 17/00* (2006.01)

(52) U.S. Cl.
CPC .......... *H01L 24/09* (2013.01); *H01F 17/0006* (2013.01); *H01L 24/48* (2013.01); *H01F 2017/0086* (2013.01); *H01L 2224/0901* (2013.01); *H01L 2224/0912* (2013.01); *H01L 2224/48227* (2013.01); *H01L 2924/19042* (2013.01); *H01L 2924/30105* (2013.01); *H01L 2924/30107* (2013.01)

(58) Field of Classification Search
None
See application file for complete search history.

(56) References Cited

U.S. PATENT DOCUMENTS

| | | | |
|---|---|---|---|
| 7,091,791 B1 * | 8/2006 | Terrovitis | H03F 3/602 330/301 |
| 7,436,203 B1 | 10/2008 | Hidri | |
| 9,048,020 B2 | 6/2015 | Calvillo | |
| 10,468,830 B2 | 11/2019 | Lee | |
| 2005/0088233 A1 * | 4/2005 | Miyashita | H03F 3/19 330/252 |
| 2006/0109023 A1 | 5/2006 | Babcock | |
| 2007/0032064 A1 * | 2/2007 | Behzad | H01L 23/50 438/612 |
| 2007/0075432 A1 | 4/2007 | Shu | |
| 2013/0300455 A1 * | 11/2013 | Thirugnanam | H03K 19/018514 326/82 |
| 2015/0162744 A1 | 6/2015 | Liu | |
| 2015/0271914 A1 | 9/2015 | Lai | |

FOREIGN PATENT DOCUMENTS

TW          I414053 B       11/2013

* cited by examiner

*Primary Examiner* — Jany Richardson
(74) *Attorney, Agent, or Firm* — Winston Hsu

(57) ABSTRACT

A semiconductor die includes a processing circuit, a first bond pad, and a second bond pad. The first bond pad is electrically connected to a first node of the processing circuit and a first bond wire. The second bond pad is electrically connected to a second node of the processing circuit and a second bond wire. The first bond wire and the second bond wire are magnetically coupled to form a first bond wire T-coil circuit with equivalent negative inductance.

17 Claims, 5 Drawing Sheets

US 12,327,806 B2

1

SEMICONDUCTOR DIE WITH PECULIAR BOND PAD ARRANGEMENT FOR LEVERAGING MUTUAL INDUCTANCE BETWEEN BOND WIRES TO REALIZE BOND WIRE T-COIL CIRCUIT WITH EQUIVALENT NEGATIVE INDUCTANCE

BACKGROUND OF THE INVENTION

1. Field of the Invention

The present invention relates to a semiconductor die, and more particularly, to a semiconductor die with a peculiar bond pad arrangement for leveraging mutual inductance between bond wires to realize a bond wire T-coil circuit with equivalent negative inductance.

2. Description of the Prior Art

Inductive components, such as inductors and transformers, are used in a variety of circuits. For example, inductors may be one type of on-die passive device commonly employed in many integrated circuits. In some applications, on-die T-coil circuits may be used to compensate parasitic capacitance. The use of on-die T-coil circuits within a semiconductor die, however, leads to a larger die area inevitably. Thus, there is a need for an innovative design which can compensate parasitic capacitance without using on-die T-coil circuits.

SUMMARY OF THE INVENTION

One of the objectives of the claimed invention is to provide a semiconductor die with a peculiar bond pad arrangement for leveraging mutual inductance between bond wires to realize a bond wire T-coil circuit with equivalent negative inductance.

According to a first aspect of the present invention, an exemplary semiconductor die is disclosed. The exemplary semiconductor die includes a processing circuit, a first bond pad, and a second bond pad. The first bond pad is electrically connected to a first node of the processing circuit and a first bond wire. The second bond pad is electrically connected to a second node of the processing circuit and a second bond wire. The first bond wire and the second bond wire are magnetically coupled to form a first bond wire T-coil circuit with equivalent negative inductance.

According to a second aspect of the present invention, an exemplary semiconductor die is disclosed. The exemplary semiconductor die includes a differential circuit, a first bond pad, and a second bond pad. The first bond pad is electrically connected to a first node of the differential circuit, wherein a first signal at the first node is a positive signal of a first differential signal. The second bond pad is electrically connected to a second node of the differential circuit, wherein a second signal at the second node is a negative signal of a second differential signal. The first bond pad is adjacent to the second bond pad.

These and other objectives of the present invention will no doubt become obvious to those of ordinary skill in the art after reading the following detailed description of the preferred embodiment that is illustrated in the various figures and drawings.

2

Figure 1:
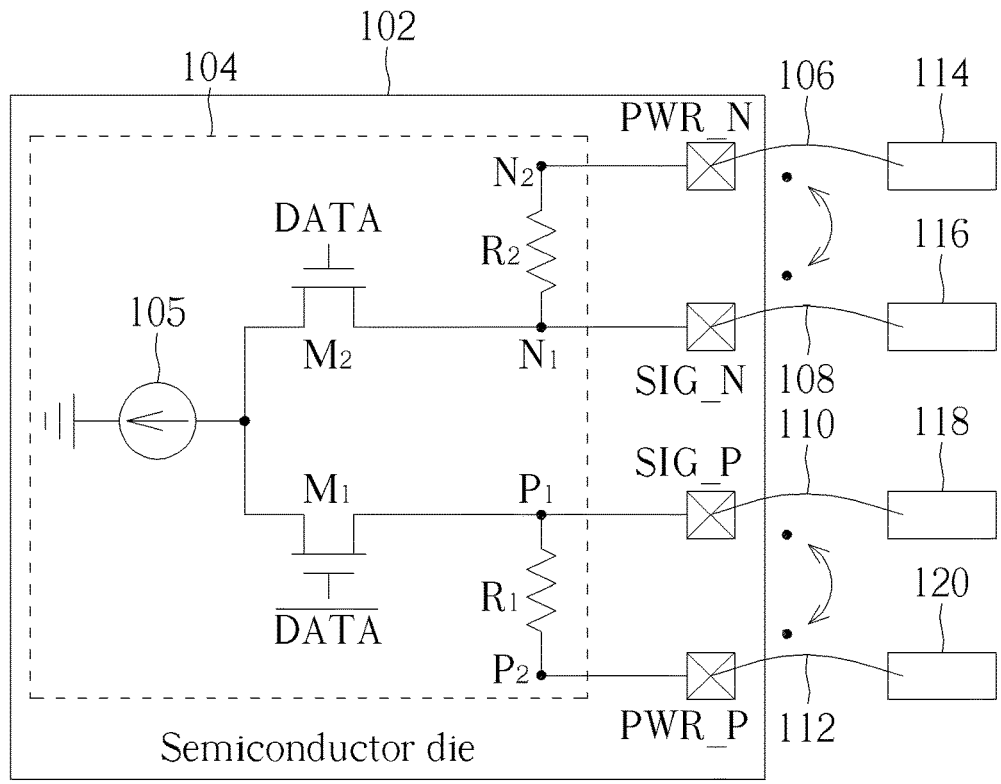
FIG. 1 is a diagram illustrating a first semiconductor die according to an embodiment of the present invention.
Figure 2:
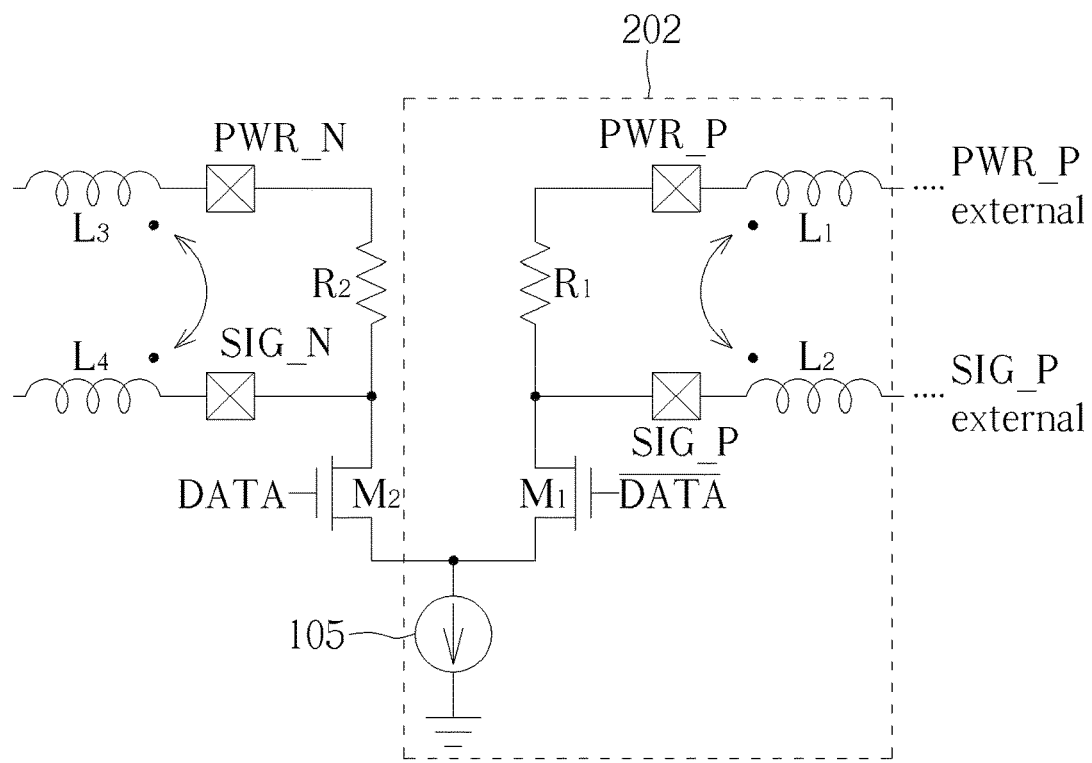

FIG. 2 is a diagram illustrating an equivalent circuit of a processing circuit and a plurality of bond wires shown in FIG. 1.

Figure 3:
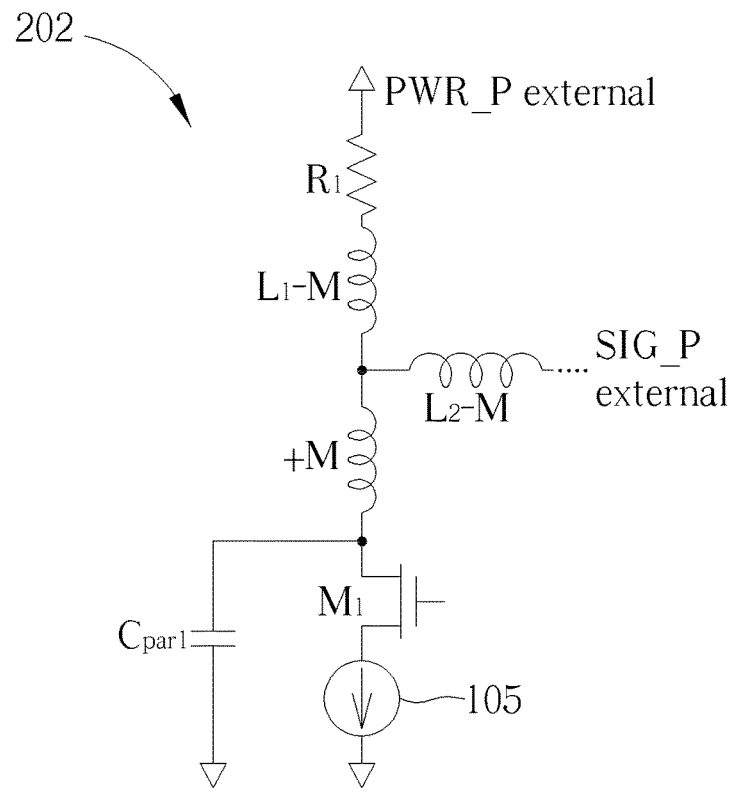

FIG. 3 is a diagram illustrating an equivalent circuit of a partial circuit shown in FIG. 2.

Figure 4:
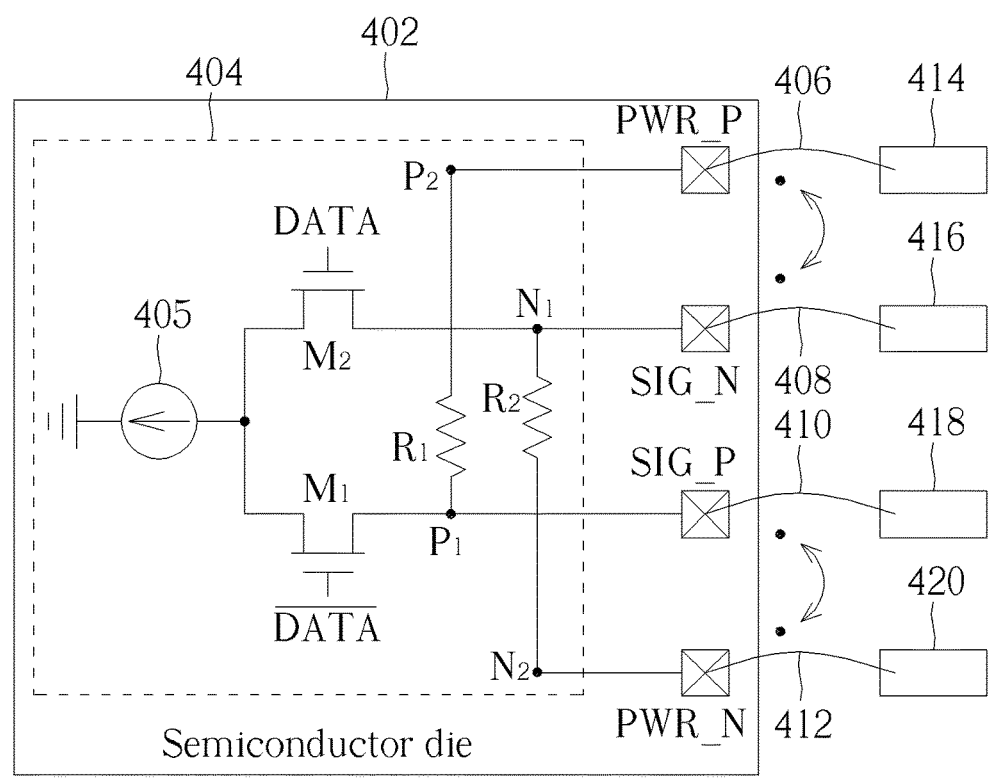

FIG. 4 is a diagram illustrating a second semiconductor die according to an embodiment of the present invention.

Figure 5:
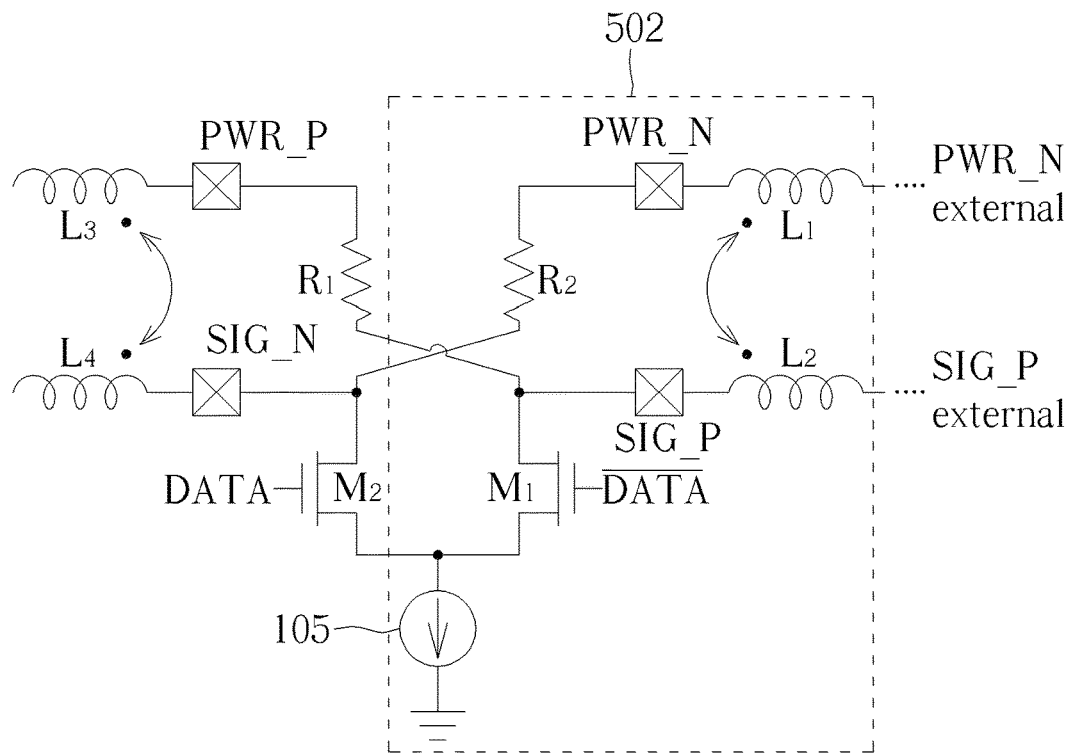

FIG. 5 is a diagram illustrating an equivalent circuit of a processing circuit and a plurality of bond wires shown in FIG. 1.

Figure 6:
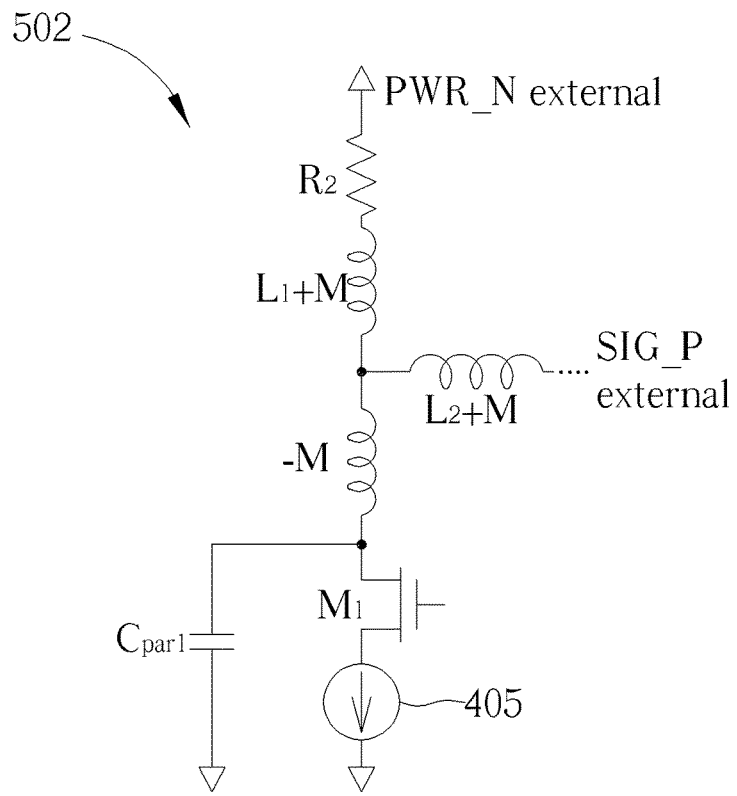

FIG. 6 is a diagram illustrating an equivalent circuit of a partial circuit in FIG. 5.

Figure 7:
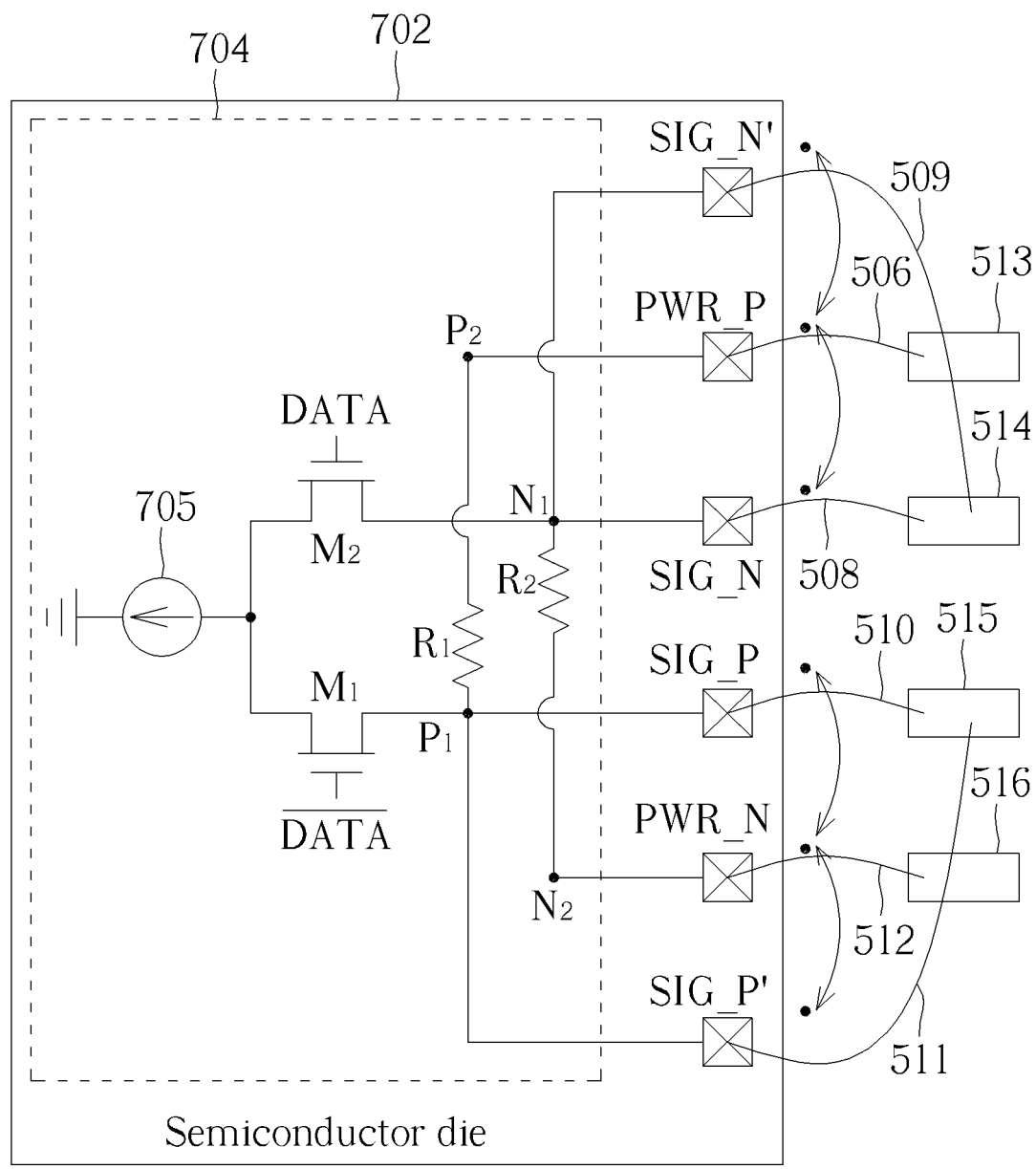

FIG. 7 is a diagram illustrating a third semiconductor die according to an embodiment of the present invention.

Figure 8:
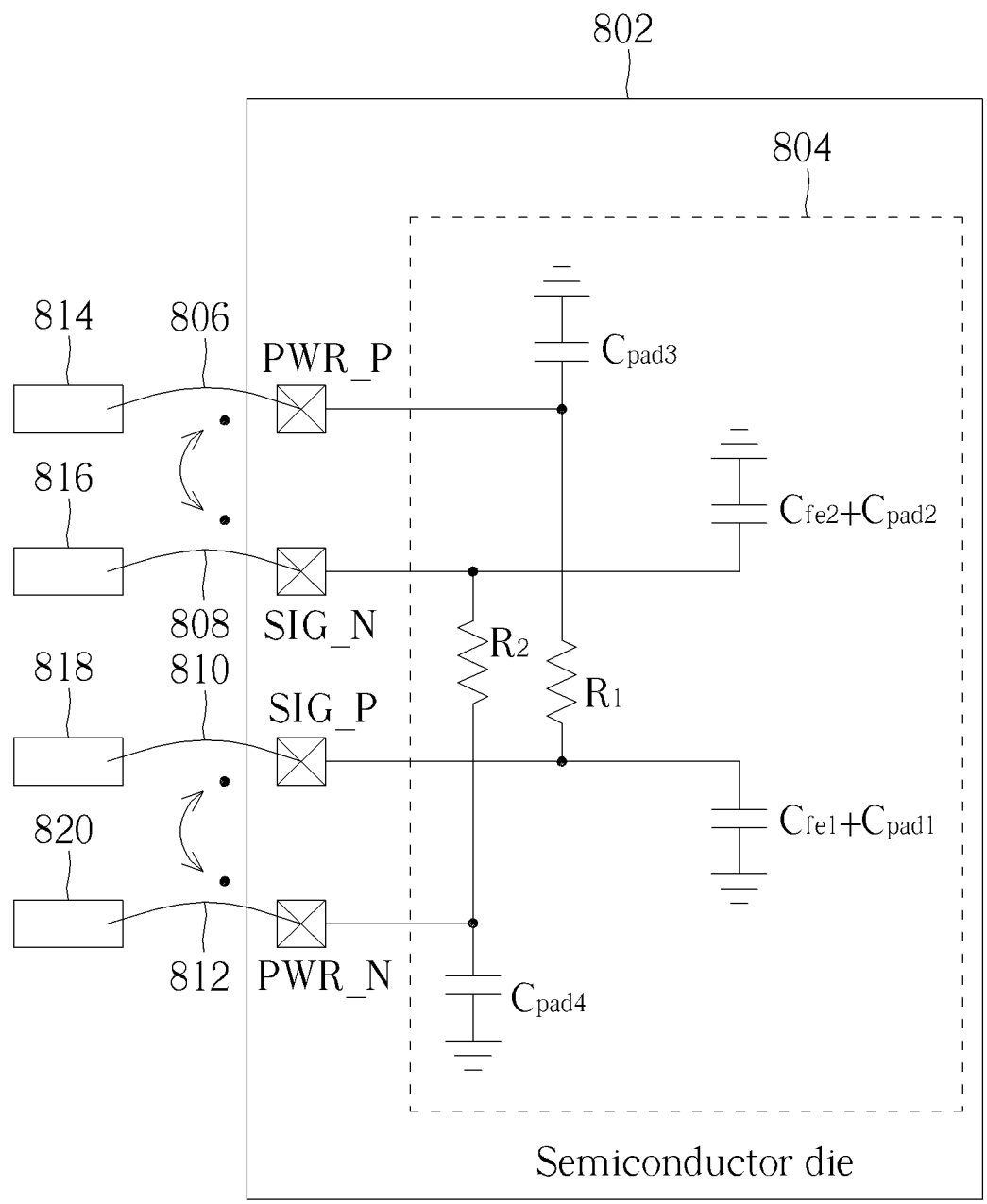

FIG. 8 is a diagram illustrating a fourth semiconductor die according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

FIG. 1 is a diagram illustrating a first semiconductor die according to an embodiment of the present invention. The semiconductor die 102 includes a processing circuit 104 and a plurality of bond pads SIG_P, SIG_N, PWR_P, PWR_N. For example, the bond pads SIG_P and SIG_N are categorized as input/output (I/O) pads, and the bond pads PWR_P and PWR_N are categorized as power/ground pads. The processing circuit 104 is a differential circuit including a tail current source 105, a plurality of transistors $M_1$, $M_2$, and a plurality of resistors $R_1$, $R_2$, where a differential data input (DATA, $\overline{\text{DATA}}$) is applied to gate terminals of the transistors M1, M2. The processing circuit 104 may be a part of a transmitter circuit, such as an output driver of a Serializer/Deserializer (SerDes) circuit. The bond pad SIG_N is electrically connected to a node $N_1$ of the processing circuit 104. The bond pad PWR_N is electrically connected to a node $N_2$ of the processing circuit 104. The bond pad SIG_P is electrically connected to a node $P_1$ of the processing circuit 104. The bond pad PWR_P is electrically connected to a node $P_2$ of the processing circuit 104. Furthermore, the bond pads PWR_N, SIG_N, SIG_P, PWR_P are connected to external bond pads (e.g., bond pads on a printed circuit board) 114, 116, 118, 120 through bond wires 106, 108, 110, 112, respectively. The bond pad SIG_N is adjacent to the bond pad PWR_N. Hence, the bond wires 106 and 108 act as bond wire inductors that are magnetically coupled, resulting in mutual inductance between the bond wires 106 and 108. The bond pad SIG_P is adjacent to the bond pad PWR_P. Hence, the bond wires 110 and 112 act as bond wire inductors that are magnetically coupled, resulting in mutual inductance between the bond wires 110 and 112.

FIG. 2 is a diagram illustrating an equivalent circuit of the processing circuit 104 and the bond wires 106, 108, 110, 112 shown in FIG. 1. The bond wires 112 and 110 are mutually coupled inductors $L_1$ and $L_2$ that are connected to the bond pads PWR_P and SIG_P, respectively. Since a signal at the node $P_1$ is a positive signal of a first differential signal (e.g., a differential data signal to be transmitted) and a signal at the node $P_2$ is a positive signal of a second differential signal (e.g., a differential power signal resulting from an external direct current (DC) reference voltage and currents passing through bond wire inductors), the mutually coupled inductors $L_1$ and $L_2$ form a bond wire T-coil circuit with equivalent positive inductance +M, where M denotes the mutual inductance between inductors $L_1$ and $L_2$. FIG. 3 is a diagram illustrating an equivalent circuit of a partial circuit 202 in FIG. 2. It should be noted that a series connection of the equivalent positive inductance +M (which is introduced by the bond wire T-coil circuit) and the parasitic capacitance $C_{par1}$ of the transistor $M_1$ is unable to reduce the parasitic capacitance looking into the transistor $M_1$.

Similarly, the bond wires 106 and 108 are mutually coupled inductors $L_3$ and $L_4$ that are connected to the bond pads PWR_N and SIG_N, respectively. Since a signal at the node $N_1$ is a negative signal of the first differential signal (e.g., the differential data signal to be transmitted) and a signal at the node $N_2$ is a negative signal of the second differential signal (e.g., the differential power signal resulting from the external DC reference voltage and currents passing through bond wire inductors), the mutually coupled inductors $L_3$ and $L_4$ form another bond wire T-coil circuit with equivalent positive inductance. A series connection of the equivalent positive inductance (which is introduced by another bond wire T-coil circuit) and the parasitic capacitance of the transistor $M_2$ is unable to reduce the parasitic capacitance looking into the transistor $M_2$.

A bond wire T-coil circuit with equivalent positive inductance is unable to compensate the parasitic capacitance. To address this issue, the present invention proposes a semiconductor die with a peculiar bond pad arrangement for leveraging mutual inductance between bond wires to realize a bond wire T-coil circuit with equivalent negative inductance.

FIG. 4 is a diagram illustrating a second semiconductor die according to an embodiment of the present invention. The semiconductor die 402 includes a processing circuit 404 and a plurality of bond pads SIG_P, SIG_N, PWR_P, PWR_N. For example, the bond pads SIG_P and SIG_N are categorized as I/O pads, and the bond pads PWR_P and PWR_N are categorized as power/ground pads. The processing circuit 404 is a differential circuit, including a tail current source 405, a plurality of transistors $M_1$, $M_2$, and a plurality of resistors $R_1$, $R_2$, where a differential data input (DATA, $\overline{DATA}$) is applied to gate terminals of the transistors M1, M2. The processing circuit 404 may be a part of a transmitter circuit, such as an output driver of a SerDes circuit. The bond pad SIG_N is electrically connected to a node $N_1$ of the processing circuit 404. The bond pad PWR_N is electrically connected to a node $N_2$ of the processing circuit 404. The bond pad SIG_P is electrically connected to a node $P_1$ of the processing circuit 404. The bond pad PWR_P is electrically connected to a node $P_2$ of the processing circuit 404. Furthermore, the bond pads PWR_P, SIG_N, SIG_P, PWR_N are connected to external bond pads (e.g., bond pads on a printed circuit board) 414, 416, 418, 420 through bond wires 406, 408, 410, 412, respectively. In accordance with the peculiar bond pad arrangement, the bond pad SIG_N is adjacent to the bond pad PWR_P, and the bond pad SIG_P is adjacent to the bond pad PWR_N. Specifically, a distance between the bond pad SIG_P and the bond pad PWR_N is shorter than a distance between the bond pad SIG_P and the bond pad PWR_P, and a distance between the bond pad SIG_N and the bond pad PWR_P is shorter than a distance between the bond pad SIG_N and the bond pad PWR_N.

Since the bond pad SIG_N is adjacent to the bond pad PWR_P rather than the bond pad PWR_N, the bond wires 406 and 408 act as bond wire inductors that are magnetically coupled, resulting in mutual inductance between the bond wires 406 and 408. Since the bond pad SIG_P is adjacent to the bond pad PWR_N rather than the bond pad PWR_P, the bond wires 410 and 412 act as bond wire inductors that are magnetically coupled, resulting in mutual inductance between the bond wires 410 and 412.

FIG. 5 is a diagram illustrating an equivalent circuit of the processing circuit 404 and the bond wires 406, 408, 410, 412 shown in FIG. 4. The bond wires 412 and 410 are mutually coupled inductors $L_1$ and $L_2$ that are connected to the bond pads PWR_N and SIG_P, respectively. In accordance with the peculiar bond pad arrangement, the processing circuit 404 has a cross-coupling connection configuration. Since a signal at the node $P_1$ is a positive signal of a first differential signal (e.g., a differential data signal to be transmitted) and a signal at the node $N_2$ is a negative signal of a second differential signal (e.g., a differential power signal resulting from an external DC reference voltage and currents passing through bond wire inductors), the mutually coupled inductors $L_1$ and $L_2$ form a bond wire T-coil circuit with equivalent negative inductance −M, where M denotes the mutual inductance between inductors $L_1$ and $L_2$. FIG. 6 is a diagram illustrating an equivalent circuit of a partial circuit 502 in FIG. 5. It should be noted that a series connection of the equivalent negative inductance −M (which is introduced by the bond wire T-coil circuit) and the parasitic capacitance $C_{par1}$ of the transistor $M_1$ is capable of reducing the equivalent parasitic capacitance $C_{eq}$ looking into the transistor $M_1$. The parasitic capacitance compensation may be expressed by following formulas.

$$j\omega(-M) + \frac{1}{j\omega C_{par1}} = \frac{1}{j\omega \frac{C_{par1}}{1+\left(\frac{\omega}{\omega_0}\right)^2}},$$

$$\text{where } \omega_0 = \frac{1}{\sqrt{MC_{par1}}} \Rightarrow C_{eq} = \frac{C_{par1}}{1+\left(\frac{\omega}{\omega_0}\right)^2}$$

Similarly, the bond wires 406 and 408 are mutually coupled inductors $L_3$ and $L_4$ that are connected to the bond pads PWR_P and SIG_N, respectively. Since a signal at the node $N_1$ is a negative signal of the first differential signal (e.g., the differential data signal to be transmitted) and a signal at the node $P_2$ is a positive signal of the second differential signal (e.g., the differential power signal resulting from the external DC reference voltage and currents passing through bond wire inductors), the mutually coupled inductors $L_3$ and L4 form another bond wire T-coil circuit with equivalent negative inductance. A series connection of the equivalent negative inductance (which is introduced by another bond wire T-coil circuit) and the parasitic capacitance of the transistor $M_2$ is capable of reducing the equivalent parasitic capacitance looking into the transistor $M_2$.

The equivalent negative inductance introduced by a bond wire T-coil circuit depends on the mutual inductance between bond wire inductors. In some embodiments of the present invention, additional bond pad(s) and additional bond wire(s) may be added to increase the coupling factor, thereby resulting in larger equivalent negative inductance introduced by a bond wire T-coil circuit.

FIG. 7 is a diagram illustrating a third semiconductor die according to an embodiment of the present invention. The semiconductor die 702 includes a processing circuit 704 and a plurality of bond pads SIG_P, SIG_P', SIG_N, SIG_N', PWR_P, PWR_N. For example, the bond pads SIG_P, SIG_P', SIG_N, and SIG_N' are categorized as I/O pads, and the bond pads PWR_P and PWR_N are categorized as power/ground pads. The processing circuit 704 is a differential circuit, including a tail current source 705, a plurality of transistors $M_1$, $M_2$, and a plurality of resistors $R_1$, $R_2$, where a differential data input (DATA, $\overline{DATA}$) is applied to gate terminals of the transistors M1, M2. The processing circuit 704 may be a part of a transmitter circuit, such as an output driver of a SerDes circuit. Two bond pads SIG_N and SIG_N' are electrically connected to the same node $N_1$ of the processing circuit 704. The bond pad PWR_N is electrically connected to a node $N_2$ of the processing circuit 704. Two bond pads SIG_P and SIG_P' are electrically connected to the same node $P_1$ of the processing circuit 704. The bond pad PWR_P is electrically connected to a node $P_2$ of the processing circuit 704. Furthermore, the bond pads PWR_P, SIG_N, SIG_N', SIG_P, SIG_P', PWR_N are connected to bond wires 506, 508, 509, 510, 511, 512, respectively. The bond pads SIG_N and SIG_N' are connected to the same external bond pad (e.g. a bond pad on a printed circuit board) 514 through the bond wires 508 and 509, respectively. The bond pad PWR_P is connected to an external bond pad (e.g. a bond pad on a printed circuit board) 513 through the bond wire 506. The bond pads SIG_P and SIG_P' are connected to the same external bond pad (e.g. a bond pad on a printed circuit board) 515 through the bond wires 510 and 511, respectively. The bond pad PWR_N is connected to an external bond pad (e.g. a bond pad on a printed circuit board) 516 through the bond wire 512.

In accordance with the peculiar bond pad arrangement, the bond pad PWR_P is adjacent to two bond pads SIG_N and SIG_N' both connected to the same node $N_1$, and the bond pad PWR_N is adjacent to two bond pads SIG_P and SIG_P'. Hence, the bond wires 506, 508, 509 are bond wire inductors that are magnetically coupled to form one bond wire T-coil circuit with equivalent negative inductance, and the bond wires 510, 511, 512 are bond wire inductors that are magnetically coupled to form another bond wire T-coil circuit with equivalent negative inductance. Since the bond wire 506 is magnetically coupled to two adjacent bond wires 508 and 509, the mutual inductance is increased, thus leading to larger equivalent negative inductance introduced by an associated bond wire T-coil circuit. Similarly, since the bond wire 512 is magnetically coupled to two adjacent bond wires 510 and 511, the mutual inductance is increased, thus leading to larger equivalent negative inductance introduced by an associated bond wire T-coil circuit.

The number of bond wires (i.e., bond wire inductors) that are magnetically coupled to form a bond wire T-coil circuit can be increased for achieving larger equivalent negative inductance introduced by the bond wire T-coil circuit. Regarding the embodiment of the present invention, the number of bond pads connected to the same node $P_1$ is increased, and the number of bond pads connected to the same node $N_1$ is increased. However, this is for illustrative purposes only, and is not meant to be a limitation of the present invention. In an alternative design, the number of bond pads connected to the same node $P_2$ may be increased, and the number of bond pads connected to the same node $N_2$ may be increased. For example, the semiconductor die 702 may be modified to have one bond pad SIG_N adjacent to two bond pads both connected to the same node $P_2$, such that three bond wires (i.e., bond wire inductors) are magnetically coupled to form a bond wire T-coil circuit with larger equivalent negative inductance; and have one bond pad SIG_P adjacent to two bond pads both connected to the same node $N_2$, such that three bond wires (i.e., bond wire inductors) are magnetically coupled to form another bond wire T-coil circuit with larger equivalent negative inductance.

In above embodiments, the bond wire T-coil circuit with equivalent negative inductance is used to compensate parasitic capacitance of a processing circuit in a transmitter circuit. However, this is for illustrative purposes only, and is not meant to be a limitation of the present invention. In practice, any integrated circuit with the proposed peculiar bond pad arrangement for leveraging bond wire coupling to achieve the proposed bond wire T-coil circuit with equivalent negative inductance falls within the scope of the present invention.

FIG. 8 is a diagram illustrating a fourth semiconductor die according to an embodiment of the present invention. The semiconductor die 802 includes a processing circuit 804 and a plurality of bond pads PWR_P, SIG_N, SIG_P, PWR_N. Like the semiconductor die 402 in FIG. 4, the semiconductor die 802 employs a peculiar bond pad arrangement, such that two bond pads SIG_P and PWR_N are adjacent to each other and the other two bond pads SIG_N and PWR_P are adjacent to each other. For example, the bond pads SIG_P and SIG_N are categorized as I/O pads, and the bond pads PWR_P and PWR_N are categorized as power/ground pads. The processing circuit 804 is a differential circuit In this embodiment, the processing circuit 804 may be a part of a receiver circuit, such as a receiver front-end (RXFE) of a SerDes circuit, and may have a resistor-capacitor (RC) circuit, including resistors $R_1$, $R_2$ and capacitors $C_{fe1}+C_{pad1}$, $C_{fe2}+C_{pad2}$, $C_{pad3}$, $C_{pad4}$. However, this is for illustrative purposes only, and is not meant to be a limitation of the present invention.

The bond pads PWR_P, SIG_N, SIG_P, PWR_N are connected to external bond pads (e.g., bond pads on a printed circuit board) 814, 816, 818, 820 through bond wires 806, 808, 810, 812, respectively. Each of the bond wires 806, 808, 810, 812 acts as a bond wire inductor. Since the bond pad SIG_P (which is coupled to a positive signal of a first differential signal, such as a differential data signal to be received) is adjacent to the bond pad PWR_N (which is coupled to a negative signal of a second differential signal, such as a differential power signal resulting from a DC reference voltage and current passing through the bond wire inductor) according to the peculiar bond pad arrangement, the bond wires 810 and 812 are magnetically coupled to form a bond wire T-coil circuit with equivalent negative inductance. Similarly, since the bond pad SIG_N (which is coupled to a negative signal of the first differential signal, such as the differential data signal to be received) is adjacent to the bond pad PWR_P (which is coupled to a positive signal of the second differential signal, such as the differential power signal resulting from the DC reference voltage and current passing through the bond wire inductor) according to the peculiar bond pad arrangement, the bond wires 806 and 808 are magnetically coupled to form a bond wire T-coil circuit with equivalent negative inductance. The same objective of leveraging the mutual inductance between bond wires to compensate the parasitic capacitance by the peculiar bond pad arrangement of the semiconductor die is achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor die comprising:
   a processing circuit;
   a first bond pad, electrically connected to a first node of the processing circuit and a first bond wire; and
   a second bond pad, electrically connected to a second node of the processing circuit and a second bond wire;
   wherein the first bond wire and the second bond wire are magnetically coupled to form a first bond wire T-coil circuit with equivalent negative inductance.

2. The semiconductor die of claim 1, wherein the processing circuit is a differential circuit.

3. The semiconductor die of claim 2, wherein a first signal at the first node is a positive signal of a first differential signal, and a second signal at the second node is a negative signal of a second differential signal.

4. The semiconductor die of claim 2, further comprising:
   a third bond pad, electrically connected to a third node of the processing circuit and a third bond wire; and
   a fourth bond pad, electrically connected to a fourth node of the processing circuit and a fourth bond wire;
   wherein the third bond wire and the fourth bond wire are magnetically coupled to form a second bond wire T-coil circuit with equivalent negative inductance; a first differential signal comprises a first signal at the first node and a third signal at the third node; and a second differential signal comprises a second signal at the second node and a fourth signal at the fourth node.

5. The semiconductor die of claim 4, wherein the first signal at the first node is a positive signal of the first differential signal, the second signal at the second node is a negative signal of the second differential signal, the third signal at the third node is a negative signal of the first differential signal, and the fourth signal at the fourth node is a positive signal of the second differential signal.

6. The semiconductor die of claim 1, further comprising:
   a third bond pad, electrically connected to the first node of the processing circuit and a third bond wire;
   wherein the first bond wire and the second bond wire are magnetically coupled and the third bond wire and the second bond wire are magnetically coupled, to form the first bond wire T-coil circuit with equivalent negative inductance.

7. The semiconductor die of claim 1, wherein the processing circuit is a part of a transmitter circuit.

8. The semiconductor die of claim 1, wherein the processing circuit is a part of a receiver circuit.

9. The semiconductor die of claim 1, wherein the processing circuit is a part of a Serializer/Deserializer (SerDes) circuit.

10. A semiconductor die comprising:
    a differential circuit;
    a first bond pad, electrically connected to a first node of the differential circuit, wherein a first signal at the first node is a positive signal of a first differential signal;
    a second bond pad, electrically connected to a second node of the differential circuit, wherein a second signal at the second node is a negative signal of a second differential signal;
    a third bond pad, electrically connected to a third node of the differential circuit, wherein a third signal at the third node is a negative signal of the first differential signal; and
    a fourth bond pad, electrically connected to a fourth node of the differential circuit, wherein a fourth signal at the fourth node is a positive signal of the second differential signal;
    wherein the first bond pad is adjacent to the second bond pad, and the third bond pad is adjacent to the fourth bond pad.

11. The semiconductor die of claim 10, wherein a distance between the first bond pad and the second bond pad is shorter than a distance between the first bond pad and the fourth bond pad.

12. The semiconductor die of claim 10, wherein a distance between the third bond pad and the fourth bond pad is shorter than a distance between the third bond pad and the second bond pad.

13. The semiconductor die of claim 10, further comprising:
    a fifth bond pad, electrically connected to the first node of the differential circuit;
    wherein the fifth bond pad is adjacent to the second bond pad.

14. The semiconductor die of claim 10, further comprising:
    a fifth bond pad, electrically connected to the second node of the differential circuit;
    wherein the fifth bond pad is adjacent to the first bond pad.

15. The semiconductor die of claim 10 wherein the differential circuit is a part of a transmitter circuit.

16. The semiconductor die of claim 10, wherein the differential circuit is a part of a receiver circuit.

17. The semiconductor die of claim 10, wherein the differential circuit is a part of a Serializer/Deserializer (SerDes) circuit.

* * * * *